(12) United States Patent
Wu et al.

(10) Patent No.: US 11,171,608 B2
(45) Date of Patent: Nov. 9, 2021

(54) MIXING CIRCUIT

(71) Applicant: ACADEMIA SINICA, Taipei (TW)

(72) Inventors: Yi-Ching Wu, Taipei (TW); Yuh-Jing Hwang, Taipei (TW); Chau-Ching Chiong, Taipei (TW); Bo-Ze Lu, New Taipei (TW); Huei Wang, Taipei (TW)

(73) Assignee: ACADEMIA SINICA, Taipei (TW)

( * ) Notice: Subject to any disclaimer, the term of this patent is extended or adjusted under 35 U.S.C. 154(b) by 0 days.

(21) Appl. No.: 17/273,868

(22) PCT Filed: Dec. 6, 2019

(86) PCT No.: PCT/US2019/064836
§ 371 (c)(1),
(2) Date: Mar. 5, 2021

(87) PCT Pub. No.: WO2020/146070
PCT Pub. Date: Jul. 16, 2020

(65) Prior Publication Data
US 2021/0320623 A1   Oct. 14, 2021

Related U.S. Application Data

(60) Provisional application No. 62/791,222, filed on Jan. 11, 2019.

(51) Int. Cl.
*H03D 7/12* (2006.01)
*H03D 7/14* (2006.01)

(52) U.S. Cl.
CPC ........... *H03D 7/125* (2013.01); *H03D 7/1441* (2013.01); *H03D 7/1458* (2013.01); *H03D 7/1466* (2013.01); *H03D 7/1475* (2013.01)

(58) Field of Classification Search
CPC combination set(s) only.
See application file for complete search history.

(56) References Cited

U.S. PATENT DOCUMENTS

| 4,727,597 A * | 2/1988 | Dautriche | H03D 7/125 455/252.1 |
| 2011/0148478 A1* | 6/2011 | Kang | H03D 7/1458 327/113 |
| 2012/0262216 A1* | 10/2012 | Chen | H03D 7/1458 327/356 |

* cited by examiner

*Primary Examiner* — Long Nguyen
(74) *Attorney, Agent, or Firm* — WPAT, PC

(57) ABSTRACT

The present invention is to provide a mixing circuit, comprising: a first transistor; a second transistor; a third transistor; a first connection point connected to a gate terminal of the first transistor, a drain terminal of the second transistor and a source terminal of the third transistor; a second connection point connected to a source terminal of the first transistor and a gate terminal of the second transistor; and a third connection point connected to a drain terminal of the first transistor and a drain terminal of the third transistor.

20 Claims, 8 Drawing Sheets

COMPARISON OF BOTH BROADBAND IF AND RF OF MIXERs

| Ref. | Tech. | RF Freq. (GHz) | IF 3-dB Bandwidth (GHz) | Conversion Gain (dB) | LO Power (dBm) | ISO. LO-to-RF (dB) | dc Power (mW) | Chip size |
|---|---|---|---|---|---|---|---|---|
| [4] | 90 nm CMOS | 30–90 | dc–26 at LO 30 GHz<br>dc–22 at LO 40 GHz<br>dc–21 at LO 50 GHz<br>dc–23 at LO 60 GHz<br>dc–16 at LO 90 GHz | −6.1 ~ −11.6 | 2.3–2.6 at 30–67 GHz<br>4.4–4.2 at 75–90 GHz | > 30.2 | 0.6 (w/o LO power)<br>2.2 (w/ LO power) | 0.389 mm^2 |
| [5] | 0.15 μm pHEMT | 75–112 | dc–26 at RF 86 GHz | −9 ~ −13 | 5 | 42 | 24 | 1 mm^2 |
| | | 75–120 | dc–24 at RF 96 GHz | −10 ~ −17 | 7 | 41.5 | | |
| [6] | GaAs | 25–67 | dc–30 | −9 | 13 | 33 | 50 | N/A |
| [7] | GaAs | 8–32 | dc–10 | −7 | 10 | 36 | 50 | ~0.01cm^2 |
| [8] | 28 nm Bulk CMOS | 127–140 | 6.5 | −22 ~ −27 | 0 | > 40 | 0 | 0.543 mm^2 |
| This Work | 40 nm CMOS | 60–148 | Upper sideband<br>dc–36 at LO 70–110 GHz<br>Lower sideband<br>dc–36 at LO 100–130GHz | −8 ~ −14 | 0 | > 40 (60–140 GHz) | 0.7 (w/o LO power)<br>2 (w/ LO power) | 0.22 mm^2 (w/ pads)<br>0.144 mm^2 (w/o pads) |

FIG. 11

MIXING CIRCUIT

CROSS REFERENCE TO RELATED APPLICATIONS

This application claims priority to U.S. provisional patent application, 62/791,222, filed on Jan. 11, 2019, the disclosure of which is incorporated herein by reference.

BACKGROUND OF THE INVENTION

1. Field of the Invention

The present invention relates to circuit design, and more particularly, to mixing circuit design.

2. Description of the Prior Art

Telecommunication services such as 4G and 5G are essential in modern societies. People use smartphones with wireless telecommunication functions every day. In addition, IoT (internet of thing) technologies also provide interconnections between devices. All of these networked devices need to transmit and to receive signals modulated in RF (radio frequency). And processors equipped in the devices have to up-convert and/or to down-convert signals between RF and IF (intermediate frequency). Mixing circuits are used to convert signals in different frequency according to a clock signal provided by LO (local oscillator).

In order to raise data rate in transmission, the devices have to work on higher frequency spectrum. As known by persons having ordinary skill in the art, it is getting more difficult in dealing with higher frequency signals. In addition to frequency spectrum, it is also getting more difficult in dealing with signals in broadband. Frequency and its bandwidth constitute design challenges of mixing circuits or mixers.

In practices, it is also desired to lower power consumption and driving power of operations of mixing circuits. These two factors influence the power consumption of mobile devices. In a highly compact mobile device, it is also important to have good port-to-port isolation of the mixing circuit in order to minimize interferences between electronic components. At last, a compact chip size required by the mixing circuit is in need because the volumes of mobile devices are very limited.

In short, existing mixing circuit designs cannot fulfill more demanding requirements of frequency spectrum, bandwidth, power consumption, driving power, size, isolation and stability. The market is always seeking mixing circuit designs improved in these requirements. To date, most prior art designs are power hungry or compromised with large LO power. Some prior art designs feature wide RF bandwidth but limited IF bandwidth.

From the above it is clear that prior art still has shortcomings. In order to solve these problems, efforts have long been made in vain, while ordinary products and methods offering no appropriate structures and methods. Thus, there is a need in the industry for a novel technique that solves these problems.

SUMMARY OF THE INVENTION

In order to fulfill the requirements, the mixing circuit provided by the present invention achieves remarkably wide bandwidths for both RF and IF by the innovative connection topology of three transistors. It also provides good stability, port-to-port isolation, low dc power consumption, low LO driving power, and much improved chip-sized products. In various applications, the mixing circuits provided by the invention features high data rate and time-saving transmission.

One object of the present invention is to provide a mixing circuit, comprising: a first transistor; a second transistor; a third transistor; a first connection point connected to a gate terminal of the first transistor, a drain terminal of the second transistor and a source terminal of the third transistor; a second connection point connected to a source terminal of the first transistor and a gate terminal of the second transistor; and a third connection point connected to a drain terminal of the first transistor and a drain terminal of the third transistor.

In one embodiment, the first transistor, the second transistor and the third transistor are a kind of field effect transistors. There are many kinds of field effect transistors in the electronic industry. In order to being adaptive to various applications, the transistors may be implemented as different kinds of field effect transistors or bipolar junction transistors.

In one embodiment, the mixing circuit is implemented by CMOS fabricated process. Kinds of CMOS fabricated processes are very common and cheap in the semiconductor manufacture industry.

In one embodiment, the mixing circuit is implemented by HEMT fabricated process. Since HEMT transistors may be able to operate at higher frequencies than other ordinary transistor, the mixing circuit may be implemented by HEMT technology.

In one embodiment, the mixing circuit is a down converter circuit. A first signal and a second signal are being applied to the first connection point and the second connection point, respectively, and a third signal is being extracted from the third connection point. The embodiments shown in FIGS. 4 and 5 provide down conversion function.

In one embodiment, the third signal is an IF signal. One of the first signal and the second signal is a RF signal, and another one of the first signal and the second signal is a LO signal. If the mixing circuit is used in a receiver for receiving RF signal, the mixing circuit does down conversion of RF signal to IF signal with reference to LO signal.

In one embodiment, the mixing circuit is a up converter circuit. A first signal and a second signal are being applied to the first connection point and the second connection point, respectively, a third signal is being extracted from the third connection point. The embodiments shown in FIGS. 6 and 7 provide up conversion function.

In one embodiment, the third signal is a RF signal. One of the first signal and the second signal is a IF signal, and another one of the first signal and the second signal is a LO signal. If the mixing circuit is used in a transmitter for transmitting RF signal, the mixing signal does up conversion of IF signal to RF signal with reference to LO signal.

One object of the present invention is to provide a mixing circuit, comprising: a first transistor; a second transistor; a third transistor; a fourth transistor; a fifth transistor; a sixth transistor; a first connection point connected to a gate terminal of the first transistor, a drain terminal of the second transistor and a source terminal of the third transistor; a second connection point connected to a source terminal of the first transistor and a gate terminal of the second transistor; a third connection point connected to a drain terminal of the first transistor and a drain terminal of the third transistor; a fourth connection point connected to a gate terminal of the fourth transistor, a drain terminal of the fifth transistor and a source terminal of the sixth transistor; a fifth connection point connected to a source terminal of the fourth transistor and a gate terminal of the fifth transistor; and a sixth connection point connected to a drain terminal of the fourth transistor and a drain terminal of the sixth transistor.

In one embodiment, the first transistor, the second transistor, the third transistor, the fourth transistor, the fifth transistor and the sixth transistor are a kind of field effect transistors. There are many kinds of field effect transistors in the electronic industry. In order to be adaptive to various applications, the transistors may be implemented as different kinds of field effect transistors or bipolar junction transistors.

In one embodiment, the mixing circuit is implemented by CMOS fabricated process. Kinds of CMOS fabricated processes are very common and cheap in the semiconductor manufacture industry.

In one embodiment, the mixing circuit is implemented by HEMT fabricated process. Since HEMT transistors may be able to operate at higher frequencies than other ordinary transistor, the mixing circuit may be implemented by HEMT technology.

In one embodiment, the mixing circuit is a down converter circuit. A first signal is being applied to the first connection point and the fourth connection point, a second signal is being differentially applied to the second connection point and the fifth connection point, respectively, and two differential third signals are being extracted from the third connection point and the sixth connection point, respectively. The embodiments shown in FIGS. 8 and 9 provide down conversion function to generate differential signals.

In one embodiment, the two differential third signals are differential IF signals, one of the first signal and the second signal is a RF signal, and another one of the first signal and the second signal is a LO signal. If the mixing circuit is used in a receiver for receiving RF signal, the mixing circuit does down conversion of RF signal to differential IF signals with reference to LO signal.

In one embodiment, the mixing circuit is a down converter circuit. A first signal is being differentially applied to the first connection point and the fourth connection point, respectively, a second signal is being applied to the second connection point and the fifth connection point, and two differential third signals are being extracted from the third connection point and the sixth connection point, respectively. The embodiment shown in FIG. 10 provides down conversion function to generate differential signals.

In one embodiment, the two differential third signals are differential IF signals. One of the first signal and the second signal is a RF signal, and another one of the first signal and the second signal is a LO signal. If the mixing circuit is used in a receiver for receiving RF signal, the mixing circuit does down conversion of RF signal to differential IF signals with reference to LO signal.

In one embodiment, the mixing circuit is an up converter circuit. A first signal is being applied to the first connection point and the fourth connection point, a second signal is being differentially applied to the second connection point and the fifth connection point, respectively, and two differential third signals are being extracted from the third connection point and the sixth connection point, respectively.

In one embodiment, the two differential third signals are differential RF signals. One of the first signal and the second signal is a IF signal, and another one of the first signal and the second signal is a LO signal. If the mixing circuit is used in a transmitter for transmitting differential RF signals, the mixing signal does up conversion of IF signal to RF signals with reference to LO signal.

In one embodiment, the mixing circuit is an up converter circuit. A first signal is being differentially applied to the first connection point and the fourth connection point, respectively, a second signal is being applied to the second connection point and the fifth connection point, and two differential third signals are being extracted from the third connection point and the sixth connection point, respectively.

In one embodiment, the two differential third signals are differential RF signals. One of the first signal and the second signal is a IF signal, and another one of the first signal and the second signal is a LO signal. If the mixing circuit is used in a transmitter for transmitting differential RF signals, the mixing signal does up conversion of IF signal to RF signals with reference to LO signal.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein:

FIG. 11 shows a comparison table of both broadband IF and RF of mixers.

DETAILED DESCRIPTION OF THE PREFERRED EMBODIMENTS

Figure 1:
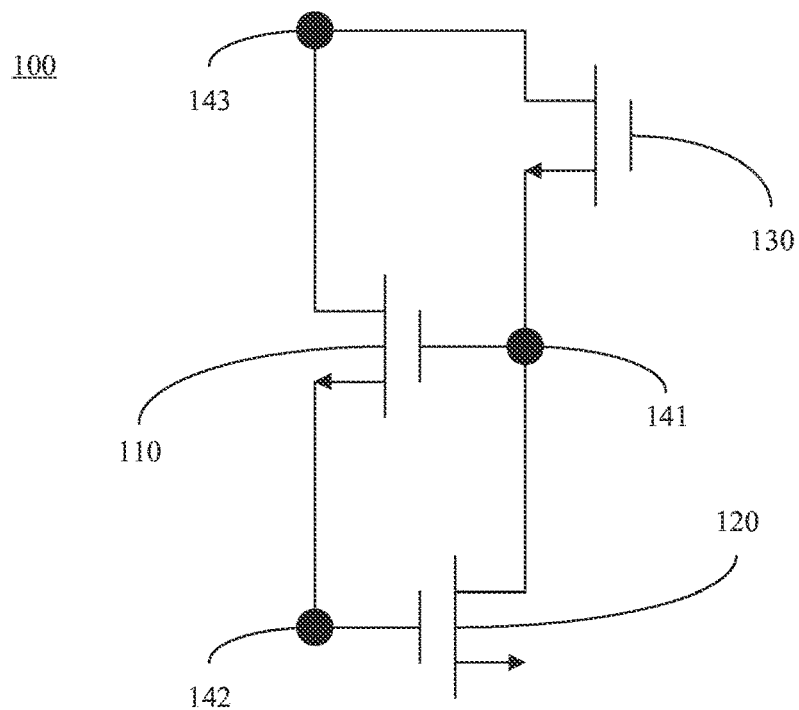
FIG. 1 shows a schematic diagram of a mixing circuit 100 according to an embodiment of the present invention.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Respond to the aforementioned requirements of the market, an innovative design of mixing circuit named JIM (joint-injection-mixer) is provided in the present invention. The provided mixing circuit design has many applications in various fields.

Wide bandwidth provided by the mixing circuit may contribute to high data rate of the telecommunication industries such as 5G systems featuring high bands including 64-71 GHz spectrum. In addition, wide IF bandwidth provided by the mixing circuit may also benefit sophisticated heterodyne receiver with higher sensitivity. For example, Atacama Large Millimeter/sub-millimeter Array (ALMA) astronomical telescopes observing millimeter waves need wide bandwidth provided by the mixing circuit. For radio astronomy, wide bandwidth implies that the observation can target different Doppler shifts representing different distances of galaxies.

Wireless local area network (WLAN), ultra wide band (UWB), point-to-point or line-of-sight communication can be benefited by the present invention. High speed video transmissions are carried out by these wireless communications. By utilizing the mixing circuit provided, high resolution video transmissions can be realized without delays.

Radars such as imaging radars in telemetry fields and in automotive industry are also applications of the present invention. They are used to detect surrounding environment. In the military fields, millimeter wave seeker equipped in tip of missile need to transmit and to receive RF signals in millimeter wave band. Illumination radars featuring frequency modulated continuous wave may be used to track and lock targets. The mixing circuit provided by the present invention can be used in the seeker and the radar sensor systems.

Please refer to FIG. 1, which shows a schematic diagram of a mixing circuit 100 according to an embodiment of the present invention. The inventive novelty resides on the topology of the mixing circuit 100 as shown in FIG. 1. The mixing circuit 100 comprises a first transistor 110, a second transistor 120 and a third transistor 130. The mixing circuit 100 may be implemented by CMOS (complementary metal oxide semiconductor) fabricated process. The type of the three transistors 110, 120 and 130 may be MOSFET (metal oxide semiconductor field effect transistor). Although the transistors 110, 120 and 130 shown in FIG. 1 are NMOS, persons have ordinary skill in the art can understand PMOS and NMOS are complementary. Therefore, the mixing circuit 100 may be implemented by PMOS in a variant of the embodiment.

As shown in FIG. 1, the gate terminal of the first transistor 110 is coupled to the drain terminal of the second transistor 120 and the source terminal of the third transistor 130. A first connection point 141 is used to connect to the gate, the drain, and the source terminals of the three transistors 110, 120 and 130, respectively. The source terminal of the first transistor 110 is coupled to the gate terminal of the second transistor 120. A second connection point 142 is used to connect to the source terminal of the first transistor 110 and the gate terminal of the second transistor 120. The drain terminal of the first transistor 110 is coupled to the drain terminal of the third transistor 130. A third connection point 142 is used to connect to the drain terminal of the first transistor 110 and the drain terminal of the third transistor 130.

Figure 2:
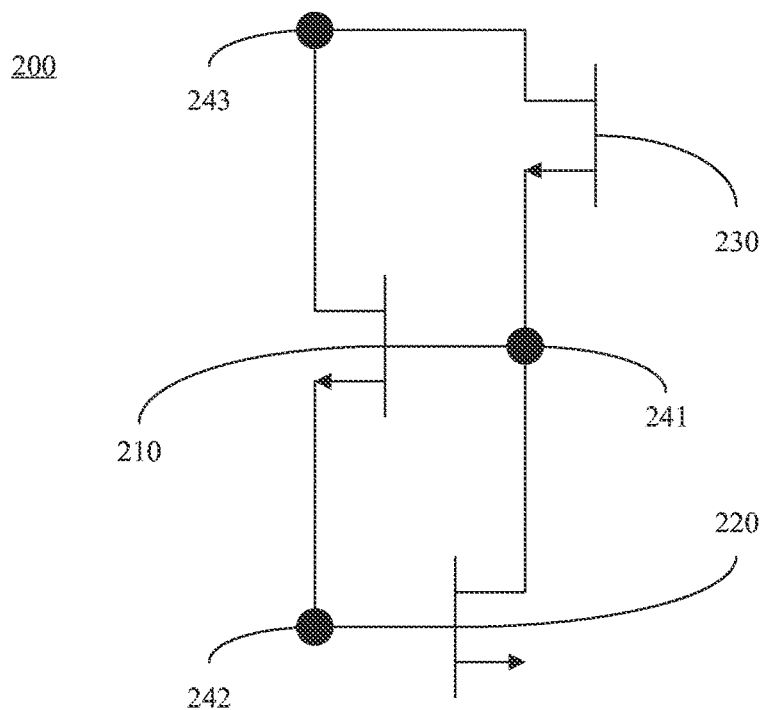
FIG. 2 shows a schematic diagram of a mixing circuit 200 according to an embodiment of the present invention.

Please refer to FIG. 2, which shows a schematic diagram of a mixing circuit 200 according to an embodiment of the present invention. The inventive novelty resides on the topology of the mixing circuit 200 as shown in FIG. 2. The mixing circuit 200 comprises a first transistor 210, a second transistor 220 and a third transistor 230. The mixing circuit 200 may be implemented by HEMT (high electron mobility transistor) fabricated process. HEMT transistors are able to operate at higher frequencies than other ordinary transistor, up to millimeter wave frequencies. In certain embodiments adapted to higher frequencies, the mixing circuit 200 may be more suitable. In additional to MOSFET and HEMT, the transistors 110, 120, 130, 210, 220 and 230 as shown in FIGS. 1 and 2 and the rest of the present invention may be implemented by any other types of field effect transistors such as FREDFET (fast recovery epitaxial diode field effect transistor), MESFET (metal semiconductor field effect transistor) and MODFET (modulation-doped semiconductor field effect transistor).

Similar to the embodiment as shown in FIG. 1, the gate terminal of the first transistor 210 is coupled to the drain terminal of the second transistor 220 and the source terminal of the third transistor 230. A first connection point 241 is used to connect to the gate, the drain, and the source terminals of the three transistors 210, 220 and 230, respectively. The source terminal of the first transistor 210 is coupled to the gate terminal of the second transistor 220. A second connection point 242 is used to connect to the source terminal of the first transistor 210 and the gate terminal of the second transistor 220. The drain terminal of the first transistor 210 is coupled to the drain terminal of the third transistor 230. A third connection point 242 is used to connect to the drain terminal of the first transistor 210 and the drain terminal of the third transistor 230.

Figure 3:
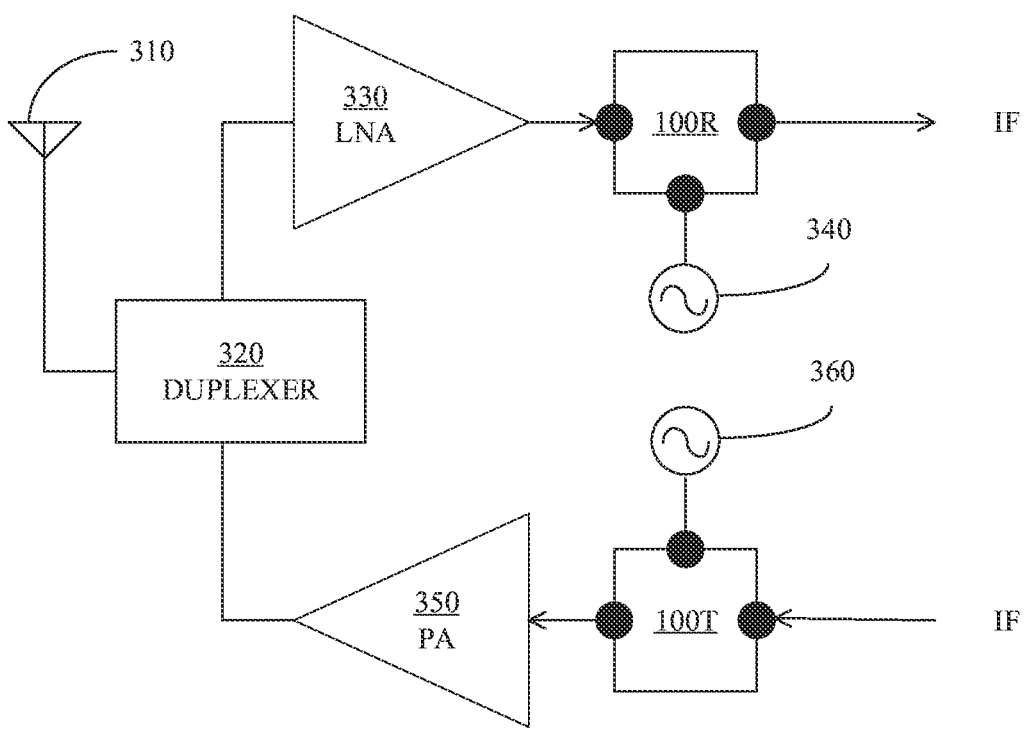
FIG. 3 depicts a schematic diagram of a transceiver 300 according to an embodiment of the present invention.

Please refer to FIG. 3, which depicts a schematic diagram of a transceiver 300 according to an embodiment of the present invention. The transceiver 300 comprises a common antenna 310, a duplexer 320 for transmitting RF signals to and receiving RF signals from the antenna 310, and a receiving channel and a transmitting channel.

The receiving channel further comprises a LNA (low noise amplifier) 330 for amplifying received RF signals, filter for screening unwanted frequencies (not shown in FIG. 3), a receiving LO 340 and a first mixing circuit 100R. The first mixing circuit 100R may be implemented as the mixing circuit 100 shown in FIG. 1 or as the mixing circuit 200 shown in FIG. 2. In order to perform down-conversion, the first mixing circuit 100R receives RF signals from the LNA 330 or filter, receives LO signals from receiving LO 340 and outputs down-converted IF signals. The down converted IF signals may be sent to a filter for high-pass or low-pass filtering.

The transmitting channel further comprises a second mixing circuit 100T for receiving IF signals to be transmitted, a transmitting LO 360, filter (not shown in FIG. 3), and a power amplifier 350 for amplifying RF signals to the duplexer 320. The second mixing circuit 100T may be implemented as the mixing circuit 100 shown in FIG. 1 or as the mixing circuit 200 shown in FIG. 2. In order to perform up-conversion, the second mixing circuit 100T receives IF signals to be transmitted, receives LO signals from the transmitting LO 360, and outputs the up-converted RF signals to filter or to the power amplifier 350.

Although the embodiment as shown in FIG. 3 is a transceiver which comprises a transmitting channel, a receiving channel and a common antenna, persons have ordinary skill in the art can understand that the receiving and transmitting channels may be separately implemented as a receiver and a transmitter. The receiver utilizing the mixing circuit 100R may be used in the aforementioned applications such as astronomical radio receiver and passive missile seeker. The transmitter utilizing the mixing circuit 100T may be used in the aforementioned applications such as illuminators. The transceiver utilizing the mixing circuits 100R and 100T may be used in the applications such as radars and communication devices.

Figure 4:
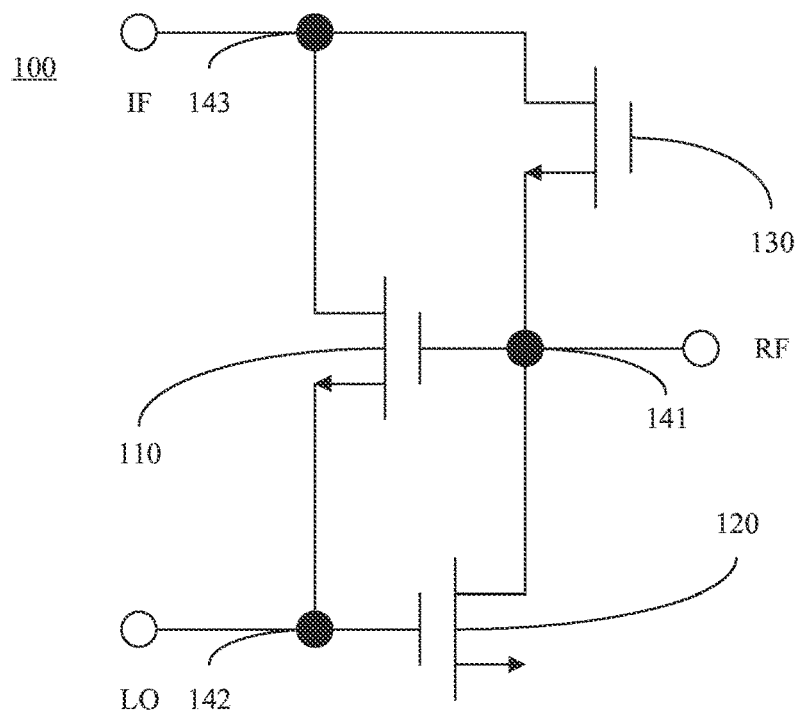
FIG. 4 illustrates a schematic diagram of a mixing circuit 100 for down-conversion according to an embodiment of the present invention.

Please refer to FIG. 4, which illustrates a schematic diagram of a mixing circuit 100 for down-conversion according to an embodiment of the present invention. The mixing circuit 100 receives LO signals and the RF signals by the second connection point 142 and the first connection point 141, respectively. IF signals are extracted from the third connection point 143. The mixing circuit 100 may be used as the first mixing circuit 100R in the receiving channel of the transceiver 300 as shown in FIG. 3.

Figure 5:
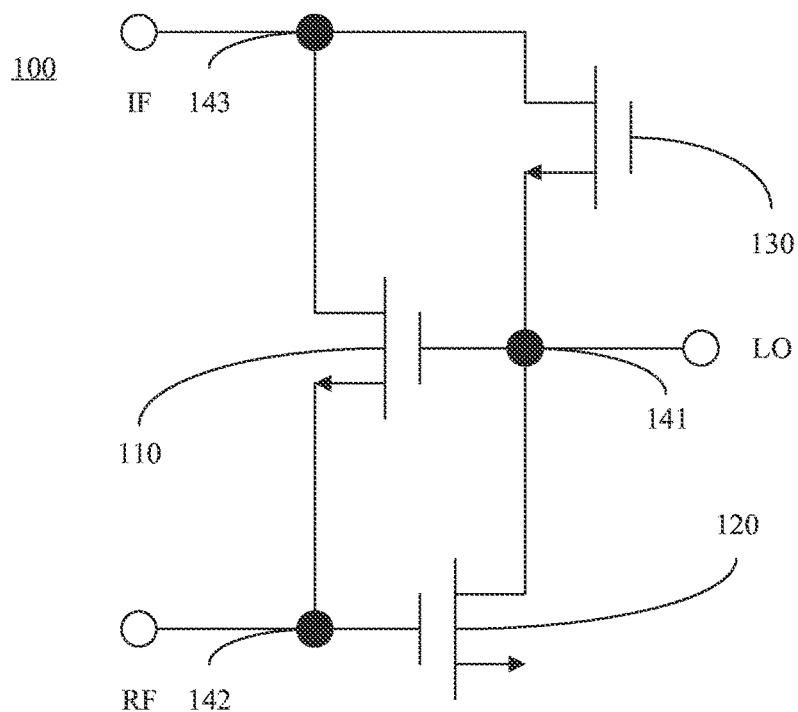
FIG. 5 illustrates a schematic diagram of a mixing circuit 100 for down-conversion according to an embodiment of the present invention.

Please refer to FIG. 5, which illustrates a schematic diagram of a mixing circuit 100 for down-conversion according to an embodiment of the present invention. The mixing circuit 100 receives LO signals and the RF signals by the first connection point 141 and the second connection point 142, respectively. IF signals are extracted from the third connection point 143. The mixing circuit 100 may be used as the first mixing circuit 100R in the receiving channel of the transceiver 300 as shown in FIG. 3.

In the embodiments as shown in FIGS. 4 and 5, the LO and RF signals are injected to the first connection point 141 and the second connection point 142. The output IF signals are extracted from the third connection point 143 in these two embodiments.

Figure 6:
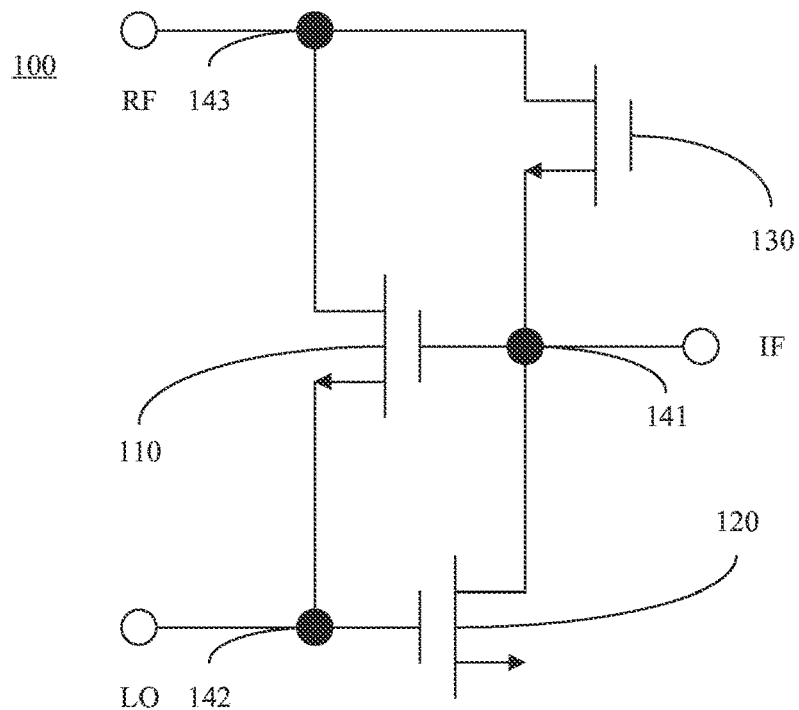
FIG. 6 illustrates a schematic diagram of a mixing circuit 100 for up-conversion according to an embodiment of the present invention.

Please refer to FIG. 6, which illustrates a schematic diagram of a mixing circuit 100 for up-conversion according to an embodiment of the present invention. The mixing circuit 100 receives LO signals and IF signals by the second connection point 142 and the first connection point 141, respectively. RF signals are extracted from the third connection point 143. The mixing circuit 100 may be used as the second mixing circuit 100T in the transmitting channel of the transceiver 300 as shown in FIG. 3.

Figure 7:
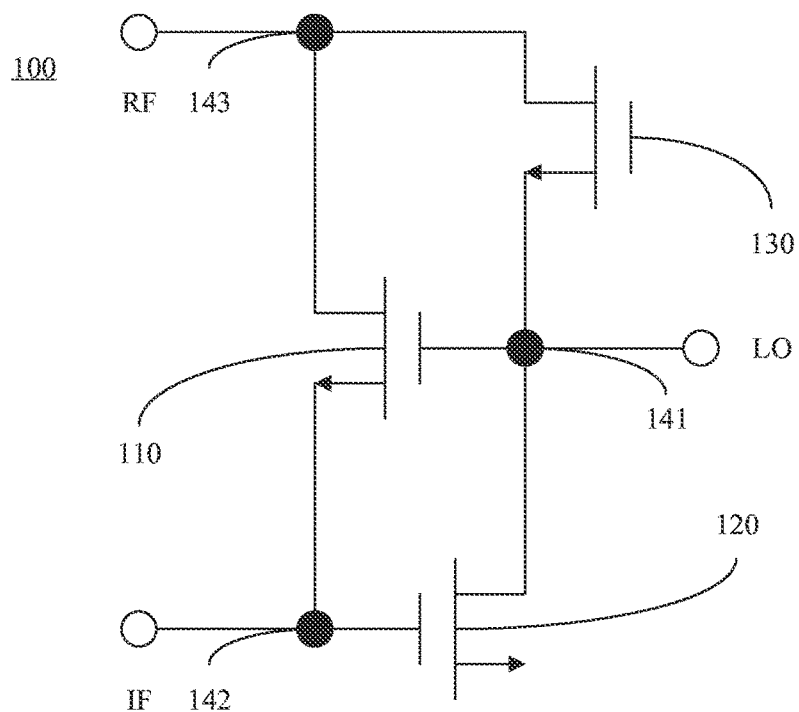
FIG. 7 illustrates a schematic diagram of a mixing circuit 100 for up-conversion according to an embodiment of the present invention.

Please refer to FIG. 7, which illustrates a schematic diagram of a mixing circuit 100 for up-conversion according to an embodiment of the present invention. The mixing circuit 100 receives LO signals and IF signals by the first connection point 141 and the second connection point 142, respectively. RF signals are extracted from the third connection point 143. The mixing circuit 100 may be used as the second mixing circuit 100T in the transmitting channel of the transceiver 300 as shown in FIG. 3.

In the embodiments as shown in FIGS. 6 and 7, the LO and IF signals are injected to the first connection point 141 and the second connection point 142. The output RF signals are extracted from the third connection point 143 in these two embodiments.

Figure 8:
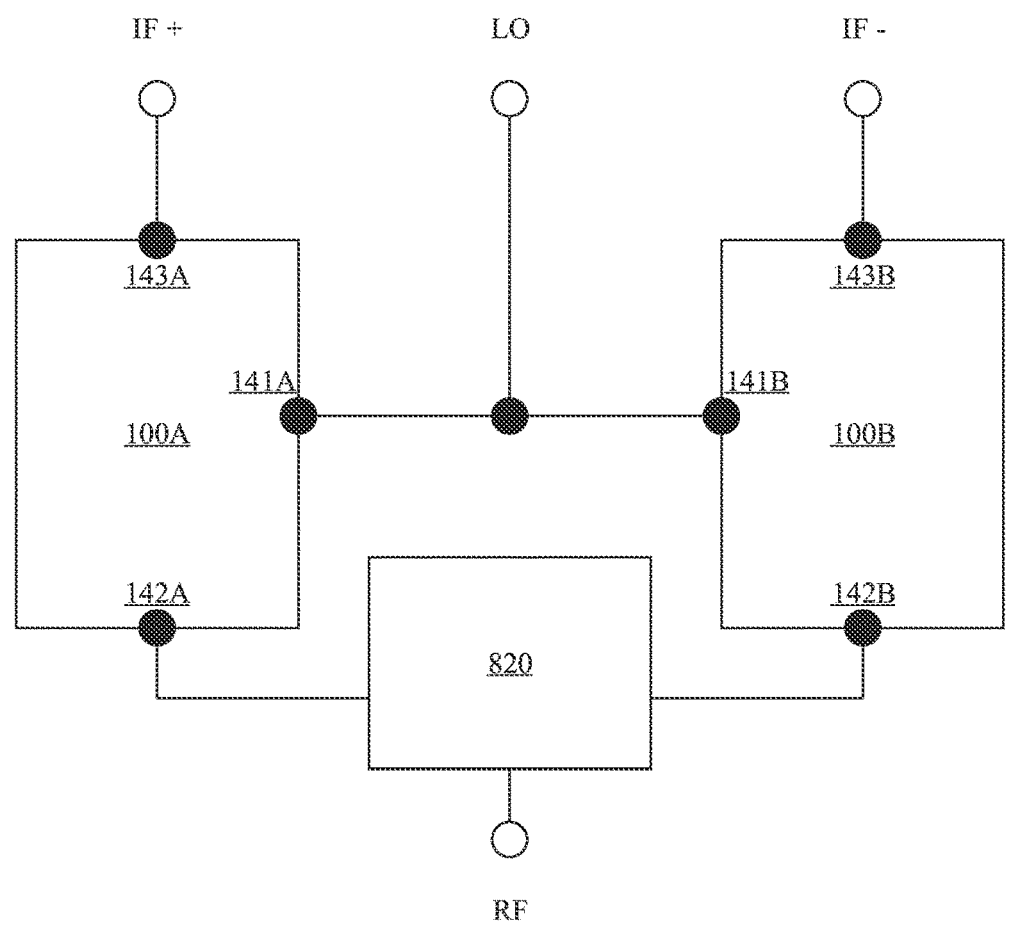
FIG. 8 illustrates a schematic diagram of a down converter circuit 800 for down-conversion according to an embodiment of the present invention.

Please refer to FIG. 8, which illustrates a schematic diagram of a down converter circuit or a mixing circuit 800 for down-conversion according to an embodiment of the present invention. In order to provide differential IF signals, this down converter circuit 800 comprises a balun circuit or a RF-compensated modified Marchand balun circuit 820 and two mixing circuits 100A and 100B. Each mixing circuits 100A and 100B can be implemented as the mixing units 100 as shown in FIGS. 1, 2, 4 and 5. The first mixing circuit 100A comprises three connection points 141A, 142A and 143A. Similarly, the second mixing circuit 100B also comprises three connection points 141B, 142B and 143B. The LO signals are fed into the first and the second mixing circuits 100A and 100B via the first connection points 141A and 141B, respectively. The singled ended RF signals are injected into the modified Marchand balun circuit 820 for producing differential RF signals which are applied to the first and the second mixing circuits 100A and 100B via the second connection points 142A and 142B, respectively. According to the differential RF signals and the LO signals, the first and the second mixing circuits 100A and 100B outputs differential IF signals from the third connection points 143A and 143B collectively.

Figure 9:
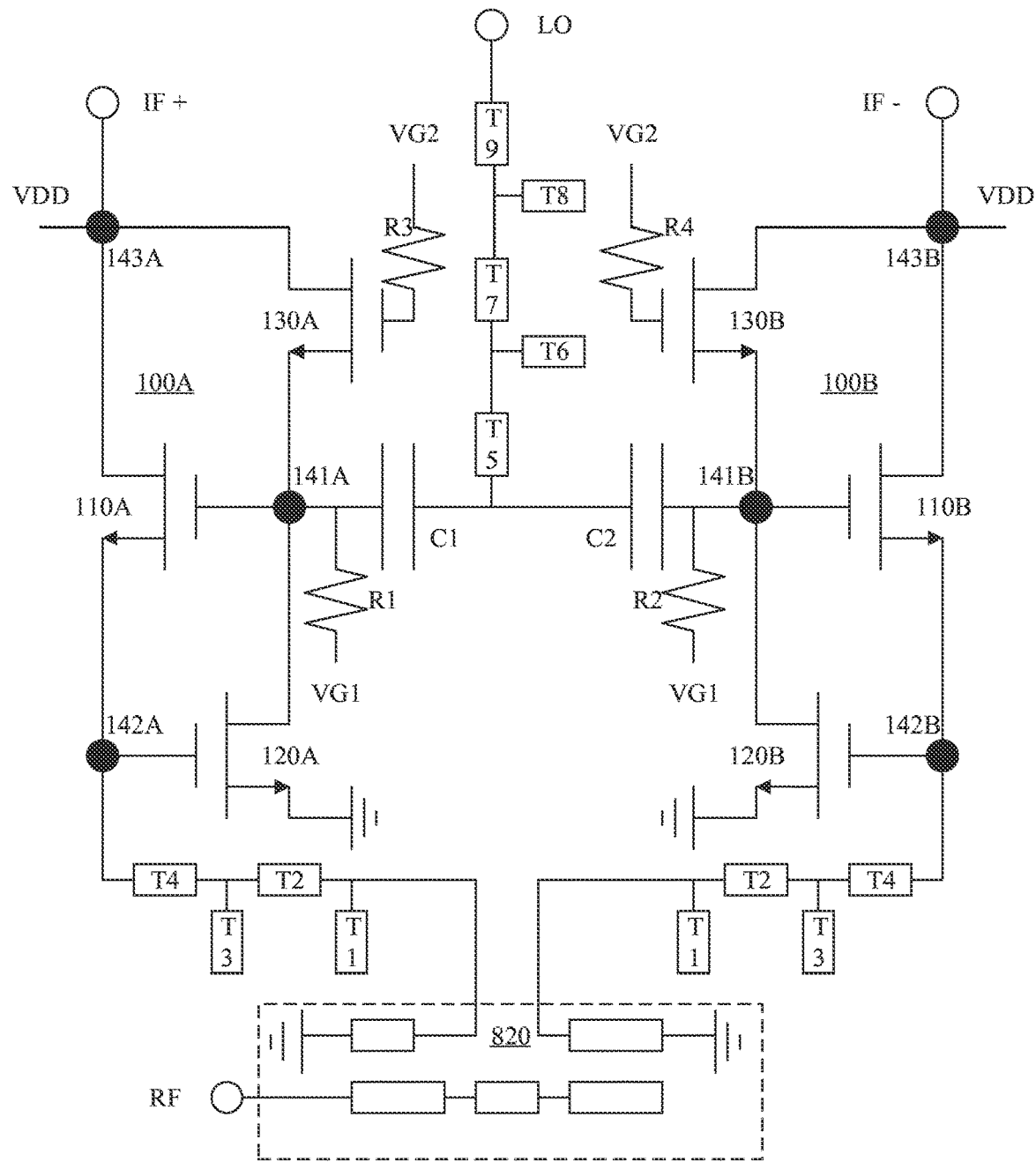
FIG. 9 illustrates a detailed circuit diagram of the down converter circuit 800 as shown in FIG. 8.

Please refer to FIG. 9, which illustrates a detailed circuit diagram of the down converter circuit 800 as shown in FIG. 8. The transmission lines T1~T4 are matched to 50Ω to connect the modified Marchand balun circuit 820 since the modified Marchand balun circuit 820 is designed for 50Ω of the characteristic impedance. The capacitors C1, C2 and transmission lines T5~T9 are matched to 50Ω under large signal at LO port. Two VG1 ports with the resistors R1 and R2 are supplied with 0.25V. Two VG2 ports with the resistors R3 and R4 are supplied with 0.5V. Two VDD ports with the third connection points 143A and 143B are supplied with 1V.

Take the left mixing circuit 100A for example, the LO signals are injected into the first connection point 141A, which provides the first, the second and the third transistors 110A, 120A, and 130A with LO gate-pumped, drain-pumped, and source-pumped types of mixing, respectively. The advantages of tying these three pumping types are LO gate-pumped and drain-pumped types providing wide LO bandwidth, and LO source-pumped type acted as a smaller resistor to relief the burden of matching effort to 50Ω. Owing the characteristics of wide bandwidth from LO gate-pumped and drain-pumped types and the ease matching from LO source-pumped type, broadband LO is achieved. In term of RF signal, the second connection point 142A is selected to be injected since only gate and source terminals could be selected as an effective input signal. In other words, generally, drain terminals cannot operate for the input signals (RF) but are suitable for the output signals (IF). In the mixing circuit 100A, source terminal of the first transistor 110A providing ease matching to 50Ω and gate terminal of the second transistor 120A offering wide RF bandwidth are tied together for the purpose of broadband RF. Regarding the expansion of IF bandwidth, the mixing circuit 100A has been conducive to the conversion gain of high IF frequencies since $C_{gd}$ (the gate-to-drain capacitance) of the first transistor 110A and the third transistor 130A facilitates the high frequencies of IF signals at the first connection point 141A. Thus, the objective of wide IF bandwidth is achieved. To ensure the three transistors 110A, 120A and 130A operated at weak inversion, the bias VG1 and VG2 are selected as 0.25V and 0.5V, respectively. The advantage of operating at weak-inversion is large $g_m/I_D$ which represents either low dc dissipation or higher gain. However, the drawback of operating at weak-inversion is low $f_T$ (transition frequency); therefore, it is difficult operate at high frequency. Fortunately, by using advanced fabricated processes, the shorter gate length is beneficial to the operation of high frequencies. In one embodiment of this design, the fabricated process is 40-nm CMOS, which provides a single poly layer and nine metal layers without the thick metal layer, metal 9, that is 0.85 μm for interconnects. The $f_{max}$ (maximum oscillation frequency) of this 40-nm CMOS process is 230 GHz. Owing to the 40-nm CMOS technology, the mixing circuit 100 design can be realized in high frequency. (RF 148 GHz).

Apparently, the embodiments shown in FIGS. 8 and 9 comprise two mixing circuits 100 as shown in FIG. 5. Person has ordinary skill in the art can understand that the down converter circuit 800 may be modified to utilize two mixing circuit 100 as shown in FIG. 4. Please refer to FIG. 10, which illustrates a schematic diagram of a down converter circuit or a mixing circuit 1000 for down-conversion according to an embodiment of the present invention. Comparing with the down converter circuit 800, the differential RF signals are fed into the mixing circuits 100A and 100B via the first connection points 141A and 141B, respectively, via the modified Marchand balun circuit 820. The LO signals are injected into the mixing circuits 100A and 100B via the second connection points 142A and 142B, respectively. Thus, differential IF signals are extracted from the third connection points 143A and 143B accordingly.

In addition to switch the first and the second connection ports between the differential IF signals and the LO signals, in one embodiment, the LO signals may be fed into the modified Marchand balun circuits to generate differential LO signals instead of RF signals.

In a variant of the embodiment as shown in FIG. 8, the feeding ports of the LO signals and the RF signals are switched. The LO signals are fed into the modified Marchand balun circuit 820 to generate differential LO signals which are further injected into the second connection ports 142A and 142B of the mixing circuits 100A and 100B, respectively. The RF signals are injected into the first connection ports 141A and 141B of the mixing circuits 100A and 100B, respectively.

Figure 10:
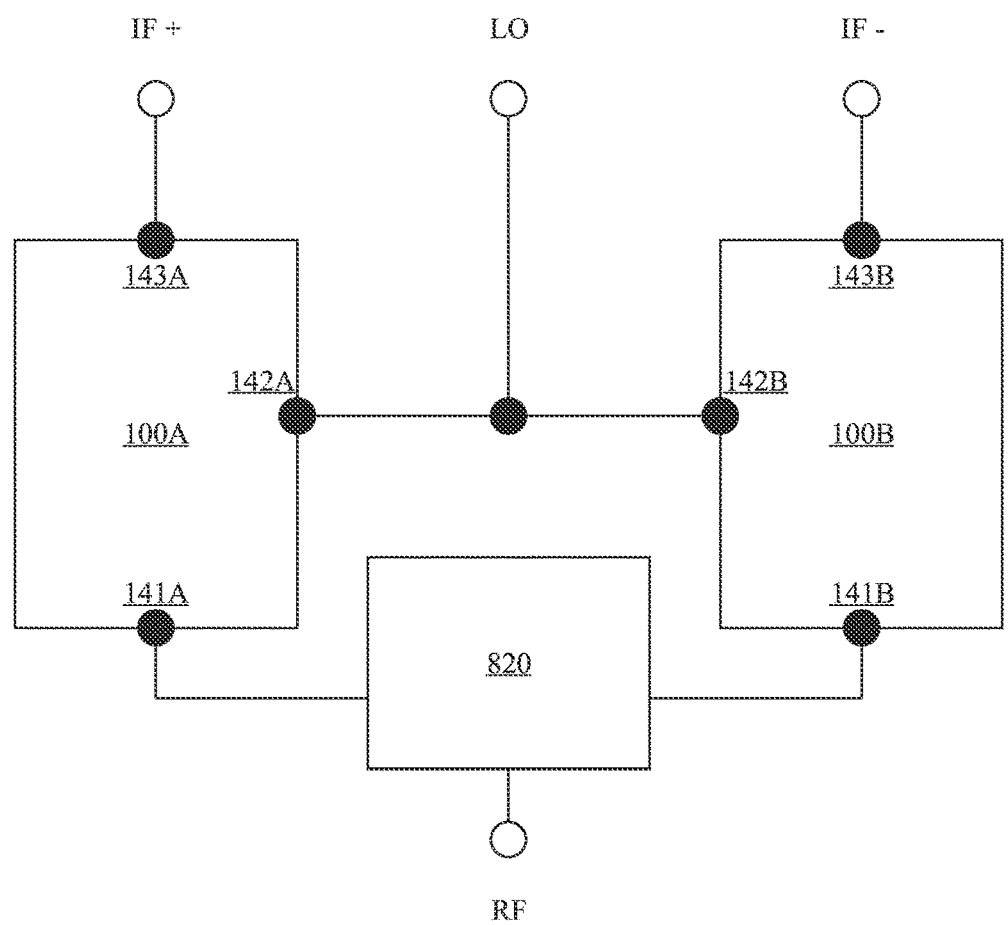
FIG. 10 illustrates a schematic diagram of a down converter circuit 1000 for down-conversion according to an embodiment of the present invention.

In a variant of the embodiment as shown in FIG. 10, the feeding ports of the LO signals and the RF signals are switched. The LO signals are fed into the modified Marchand balun circuit 820 to generate differential LO signals which are further injected into the first connection ports 141A and 141B of the mixing circuits 100A and 100B, respectively. The RF signals are injected into the second connection ports 142A and 142B of the mixing circuits 100A and 100B, respectively.

In other embodiments, the down converter circuits 800 and 1000 and their variants can be modified to become up converter circuits. Persons having ordinary skill in the art can refer to the embodiments as shown in FIGS. 6 and 7 to do the modifications. For examples, in order to generate differential RF signals from the third connection ports 143A and 143B, the mixing circuits 100A and 100B may receive LO signals and IF signals from the first connection ports 141A and 141B and the second connection ports 142A and 142B. One of the LO signals and the IF signals are selected to feed into a modified Marchand balun circuit 820 to generate differential signals before feeding into the first connection ports 141A and 141B or the second connection ports 142A and 142B.

The down-converter circuit 800 is realized in a chip by 40-nm CMOS fabricated process and the following table shows conditions and result of the chip implementation.

| Technology | 40-nm CMOS fabricated process | Experimental Results |
| --- | --- | --- |
| RF Freq. (GHz) | 60-150 | Due to instrumental limitations, only a frequency range 60-150 GHz is measured |
| CG (dB) Conversion Gain | −11~−14 | −8~−14 |
| IF 3-dB Bandwidth | Upper sideband dc-8 GHz at LO 60 | Upper sideband dc-8 GHz at LO 60 GHz |

| Technology | 40-nm CMOS fabricated process | Experimental Results |
| --- | --- | --- |
| (GHz) | GHz dc-35 GHz at LO 70~110 GHz dc-20 GHz at LO 120 GHz dc-11 GHz at LO 130 GHz dc-6 GHz at LO 140 GHz Lower sideband dc-4 GHz at LO 60 GHz dc-6 GHz at LO 70 GHz dc-16 GHz at LO 80 GHz dc-26 GHz at LO 90 GHz dc-35 GHz at LO 100~130 GHz dc-26 GHz at LO 140 GHz | dc-36 GHz at LO 70~110 GHz dc-20 GHz at LO 120 GHz dc-10 GHz at LO 130 GHz dc-6 GHz at LO 140 GHz Lower sideband dc-4 GHz at LO 60 GHz dc-6 GHz at LO 70 GHz dc-16 GHz at LO 80 GHz dc-26 GHz at LO 90 GHz dc-36 GHz at LO 100~130 GHz dc-26 GHz at LO 140 GHz |
| LO Power (dBm) | 0 | experimental results matched |
| $IP_{1\,dB}$ (dBm) | −6 @ IF 10.1 GHz and LO 120 GHz −6 @ IF 20.1 GHz and LO 120 GHz | experimental results matched |
| ISO. LO-to-RF (dB) | >40 | experimental results matched |
| dc Power (mW) | 0.7 | experimental results matched |
| Chip Area (mm$^2$) | 0.27 w/pads (0.16 w/o pads) | implementation Chip Area 0.22 mm$^2$ (w/pads) 0.144 mm$^2$ (w/o pads) |
| Data rate (Gb/s) | 90 | 90 Gb/s (256 QAM) is a theoretical estimation. The estimation method is based on the ref. [1] and ref. [2] and Equation (1). Other estimations include: 175.71 Gb/s for 64 QAM 51.25 Gb/s for 128 QAM 90 Gb/s for 256 QAM |

The data rate estimation method is described below. The IF bandwidth of ref. [1] is 8.64 GHz. The data rates of ref. [1] are 42.24 Gb/s for 64 QAM and 12.32 Gb/s for 128 QAM.
The IF bandwidth of ref. [2] is 0.8 GHz. The data rates of ref. [2] is 2 Gb/s for 256 QAM.

Data rate=2×Bandwidth (Bilevel Encoding)

Data rate=2×Bandwidth×log 2$M$ (Multilevel Encoding)  Equation (1):

According to Equation (1), data rate is proportional to bandwidth. Therefore, for the theoretical estimation, the widest IF bandwidth of the mixing circuit 100 is 36 GHz which is 4.16 times than that of reference [1] and 45 times than that of reference [2]. Based on Equation (1), the data rate of the mixing circuit 100 can be calculated as 4.16× 42.24 (Gb/s)=175.71 Gb/s for 64 QAM, 4.16×12.32 (Gb/s) =51.25 Gb/s for 128 QAM, and 45×2 Gb/s=90 Gb/s for 256 QAM Reference [1]: Jian Pang, et al., "A 128-QAM 60 GHz CMOS transceiver for IEEE802.1 lay with calibration of LO feedthrough and I/Q imbalance," *IEEE International Solid-State Circuits Conference (ISSCC)*, pp. 424-425, February 2017.

Reference [2]: Kerim Kibaroglu, et al., "A low-cost scalable 32-element 28-GHz phased array transceiver for 5G communication links based on a 2×2 beamformer flip-chip unit cell," *IEEE J. Solid-State Circuits*, vol. 53, no. 5, pp. 1260-1274, May 2018.

In one embodiment, the Metal-Insulator-Metal (MIM) capacitors of the 40-nm CMOS technology are not provided. Therefore, inter-digital capacitors comprising metal 3 to metal 9 are used in this embodiment. For the size of inter-digital capacitors, 1 pF is 50 μm×50 μm which is larger than that of MIM capacitor (26 μm×26 μm) in the CMOS 90 nm technology. Even in this embodiment, the down converter circuit 800 with all the pads occupied 0.22 mm$^2$.

Please refer to FIG. 11, which shows a comparison table of both broadband IF and RF of mixers. Compared with the prior designs, an embodiment of the mixing circuit provided by the present invention achieves the widest IF bandwidth (36 GHz) in such broadband LO frequencies (70 GHz-110 GHz at upper sideband and 100 GHz-130 GHz at lower sideband). Furthermore, covering W-band, the mixing circuit demonstrates low LO power (0 dBm). The LO power of the mixing circuit is lower than that of [4]-[7]. Although the LO power and dc power of [8] are lower than that of the mixing circuit, the conversion gains of the mixing circuit in such a wide RF bandwidth (60-148 GHz) are much better than that of [8]. Moreover, compared with the other designs, the chip size of the mixing circuit is compact (0.22 mm$^2$). The referenced prior works [4]-[8] are listed below.

Reference [4]: Y.-C. Wu, et al., "A novel 30-90 GHz singly balanced mixer with broadband LO/IF," *IEEE Trans. Microw. Theory Techn.*, vol. 64, no. 12, pp. 4611-4623, December 2016.

Reference [5]: J.-C. Kao, et al., "A W-band high LO-to-RF isolation triple cascade mixer with wide IF bandwidth," *IEEE Trans. Microw. Theory Techn.*, vol. 62, no. 7, pp. 1506-1514, July 2014.

Reference [6]: Markimicrowave.com, 'GaAs double balanced mixer MM1-2567LS', 2016 [Online] Available: http://www.markimicrowave.com/Assets/Datasheets/mm1-2567LS.pdf Reference [7]: Markimicrowave.com, 'MICROLITHIC™ double-balanced mixer ML1-0832SM' 2018 [Online]. Available: http://www.markimicrowave.com/Assets/Datasheets/m11-0832sm.pdf Reference [8]: D. Parveg, et al., "Wideband millimeter-wave active and passive mixers in 28 nm bulk CMOS technology," in *IEEE 10$^{th}$ Eur. Microw. Integr. Circuits Conf.*, September 2015, pp. 116-119.

By using an innovative mixer topology, the mixing circuit provided by the present invention features wide bandwidths of IF and RF signals. In one embodiment, the RF and IF signals frequencies of the mixing circuit cover from 60 GHz to 148 GHz and dc to 36 GHz, respectively. The LO driving power of the mixing circuit consumes 0 dBm. With 0 dBm of LO power, total dc power consumption of the mixing circuit is only 0.7 mW. The conversion gain (CG) of the mixing circuit is from −8 dB to −14 dB. The mixing circuit provided by the present invention is implemented for fundamental mixing as down-conversion and up-conversion. When operating as a down-converter, the LO-to-RF isolation of the mixing circuit is focused by utilizing the modified Marchand balun circuit and reaches better than 40 dB for the while in-band RF frequencies (60-148 GHz). The chip sizes excluding and including pads are 0.144 mm$^2$ and 0.22 mm$^2$, respectively. In this embodiment, the fabricated process of the mixing circuit is 40-nm CMOS technology.

To the best of the Inventors' knowledge, the mixing circuit provided by the present invention achieves the widest IF bandwidth with such a broadband RF compared with the prior works nowadays over the globe. Meanwhile, in terms of W-band of mixers, the mixing circuit demonstrates low LO power and low dc consumption.

The mixing circuit provided by the present invention achieves remarkably wide bandwidths for both RF and IF by the innovative connection topology of three transistors. It also provides good stability, port-to-port isolation, low dc power consumption, low LO driving power, and much improved chip-sized products. In the aforementioned applications, the mixing circuits provided by the invention features high data rate and time-saving transmission.

The mixing circuit features the widest IF bandwidth among all the existing circuit topologies of mixers in the world. This characteristic brings the advantage for high data rate communication. Currently, the developed 5G communication system is demanded to reach 10 Gb/s. By applying the circuit topology of the mixing circuit, data rates can be improved to 90 Gb/s. It is nine times of the specification for 5G communication which is planned to be implemented in 2020.

The wide LO and IF bandwidths of the provided mixing circuit can significantly improve the sensitivity, the observation efficiency, the robustness, and the reliability of the millimeter-wave heterodyne receivers for radio astronomy. Moreover, by applying this provided mixing circuit, the complexity and the number of components for the front-end receiver can, respectively, be simplified and reduced. The cost is decreased. The power consumption remains low. Nevertheless, the performances are not compromised. The amount of data received is increased at least two times, compared with the present capability of world-leading receivers.

In the demand of millimeter wave measuring instruments, factories need extremely wide bandwidth mixers to be installed in instruments including PNA-Xs, spectrum analyzers, phase noise testing instruments . . . etc. This provided mixing circuit provides broadband down converting signals. Via this provided mixing circuit, measuring instruments can detect wider bandwidth signals in order to facilitate applications and functions for high frequencies communication systems.

The dc power consumption of the proposed mixer is low (0.7 mW). It is of great benefit to conserve electricity for the communication systems and astronomical systems.

In one embodiment, the implemented size of the proposed mixer is small (0.22 mm$^2$). It brings the advantage of being compact and light. Meanwhile, the much-compact fabricated chip implies affordable cost, as cost is proportional to chip size.

One object of the present invention is to provide a mixing circuit, comprising: a first transistor; a second transistor; a third transistor; a first connection point connected to a gate terminal of the first transistor, a drain terminal of the second transistor and a source terminal of the third transistor; a second connection point connected to a source terminal of the first transistor and a gate terminal of the second transistor; and a third connection point connected to a drain terminal of the first transistor and a drain terminal of the third transistor.

In one embodiment, the first transistor, the second transistor and the third transistor are a kind of field effect transistors. There are many kinds of field effect transistors in the electronic industry. In order to being adaptive to various applications, the transistors may be implemented as different kinds of field effect transistors or bipolar junction transistors.

In one embodiment, the mixing circuit is implemented by CMOS fabricated process. Kinds of CMOS fabricated processes are very common and cheap in the semiconductor manufacture industry.

In one embodiment, the mixing circuit is implemented by HEMT fabricated process. Since HEMT transistors may be able to operate at higher frequencies than other ordinary transistor, the mixing circuit may be implemented by HEMT technology.

In one embodiment, the mixing circuit is a down converter circuit. A first signal and a second signal are being applied to the first connection point and the second connection point, respectively, and a third signal is being extracted from the third connection point. The embodiments shown in FIGS. 4 and 5 provide down conversion function.

In one embodiment, the third signal is an IF signal. One of the first signal and the second signal is a RF signal, and another one of the first signal and the second signal is a LO signal. If the mixing circuit is used in a receiver for receiving RF signal, the mixing circuit does down conversion of RF signal to IF signal with reference to LO signal.

In one embodiment, the mixing circuit is a up converter circuit. A first signal and a second signal are being applied to the first connection point and the second connection point, respectively, a third signal is being extracted from the third connection point. The embodiments shown in FIGS. 6 and 7 provide up conversion function.

In one embodiment, the third signal is a RF signal. One of the first signal and the second signal is a IF signal, and another one of the first signal and the second signal is a LO signal. If the mixing circuit is used in a transmitter for transmitting RF signal, the mixing signal does up conversion of IF signal to RF signal with reference to LO signal.

One object of the present invention is to provide a mixing circuit, comprising: a first transistor; a second transistor; a third transistor; a fourth transistor; a fifth transistor; a sixth transistor; a first connection point connected to a gate terminal of the first transistor, a drain terminal of the second transistor and a source terminal of the third transistor; a second connection point connected to a source terminal of the first transistor and a gate terminal of the second transistor; a third connection point connected to a drain terminal of the first transistor and a drain terminal of the third transistor; a fourth connection point connected to a gate terminal of the fourth transistor, a drain terminal of the fifth transistor and a source terminal of the sixth transistor; a fifth connection point connected to a source terminal of the fourth transistor and a gate terminal of the fifth transistor; and a sixth connection point connected to a drain terminal of the fourth transistor and a drain terminal of the sixth transistor.

In one embodiment, the first transistor, the second transistor, the third transistor, the fourth transistor, the fifth transistor and the sixth transistor are a kind of field effect transistors. There are many kinds of field effect transistors in the electronic industry. In order to being adaptive to various applications, the transistors may be implemented as different kinds of field effect transistors or bipolar junction transistors.

In one embodiment, the mixing circuit is implemented by CMOS fabricated process. Kinds of CMOS fabricated processes are very common and cheap in the semiconductor manufacture industry.

In one embodiment, the mixing circuit is implemented by HEMT fabricated process. Since HEMT transistors may be able to operate at higher frequencies than other ordinary transistor, the mixing circuit may be implemented by HEMT technology.

In one embodiment, the mixing circuit is a down converter circuit. A first signal is being applied to the first connection point and the fourth connection point, a second signal is being differentially applied to the second connection point and the fifth connection point, respectively, and two differential third signals are being extracted from the third connection point and the sixth connection point, respectively. The embodiments shown in FIGS. 8 and 9 provide down conversion function to generate differential signals.

In one embodiment, the two differential third signals are differential IF signals, one of the first signal and the second signal is a RF signal, and another one of the first signal and the second signal is a LO signal. If the mixing circuit is used in a receiver for receiving RF signal, the mixing circuit does down conversion of RF signal to differential IF signals with reference to LO signal.

In one embodiment, the mixing circuit is a down converter circuit. A first signal is being differentially applied to the first connection point and the fourth connection point, respectively, a second signal is being applied to the second connection point and the fifth connection point, and two differential third signals are being extracted from the third connection point and the sixth connection point, respectively. The embodiment shown in FIG. 10 provides down conversion function to generate differential signals.

In one embodiment, the two differential third signals are differential IF signals. One of the first signal and the second signal is a RF signal, and another one of the first signal and the second signal is a LO signal. If the mixing circuit is used in a receiver for receiving RF signal, the mixing circuit does down conversion of RF signal to differential IF signals with reference to LO signal.

In one embodiment, the mixing circuit is an up converter circuit. A first signal is being applied to the first connection point and the fourth connection point, a second signal is being differentially applied to the second connection point and the fifth connection point, respectively, and two differential third signals are being extracted from the third connection point and the sixth connection point, respectively.

In one embodiment, the two differential third signals are differential RF signals. One of the first signal and the second signal is a IF signal, and another one of the first signal and the second signal is a LO signal. If the mixing circuit is used in a transmitter for transmitting differential RF signals, the mixing signal does up conversion of IF signal to RF signals with reference to LO signal.

In one embodiment, the mixing circuit is an up converter circuit. A first signal is being differentially applied to the first connection point and the fourth connection point, respectively, a second signal is being applied to the second connection point and the fifth connection point, and two differential third signals are being extracted from the third connection point and the sixth connection point, respectively.

In one embodiment, the two differential third signals are differential RF signals. One of the first signal and the second signal is a IF signal, and another one of the first signal and the second signal is a LO signal. If the mixing circuit is used in a transmitter for transmitting differential RF signals, the mixing signal does up conversion of IF signal to RF signals with reference to LO signal.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A mixing circuit, comprising:
a first transistor;
a second transistor;
a third transistor;
a first connection point connected to a gate terminal of the first transistor, a drain terminal of the second transistor and a source terminal of the third transistor;
a second connection point connected to a source terminal of the first transistor and a gate terminal of the second transistor; and
a third connection point connected to a drain terminal of the first transistor and a drain terminal of the third transistor.

2. The mixing circuit of claim 1, wherein the first transistor, the second transistor and the third transistor are a kind of field effect transistors.

3. The mixing circuit of claim 1, wherein the mixing circuit is implemented by CMOS (complementary metal oxide semiconductor) fabricated process.

4. The mixing circuit of claim 1, wherein the mixing circuit is implemented by HEMT (high electron mobility transistor) fabricated process.

5. The mixing circuit of claim 1, wherein the mixing circuit is a down converter circuit, a first signal and a second signal are being applied to the first connection point and the second connection point, respectively, and a third signal is being extracted from the third connection point.

6. The mixing circuit of claim 5, wherein the third signal is an IF (intermediate frequency) signal, one of the first signal and the second signal is a RF (radio frequency) signal, and another one of the first signal and the second signal is a LO (local oscillator) signal.

7. The mixing circuit of claim 1, wherein the mixing circuit is an up converter circuit, a first signal and a second signal are being applied to the first connection point and the second connection point, respectively, and a third signal is being extracted from the third connection point.

8. The mixing circuit of claim 7, wherein the third signal is a RF signal, one of the first signal and the second signal is an IF signal, and another one of the first signal and the second signal is a LO signal.

9. A mixing circuit, comprising:
a first transistor;
a second transistor;
a third transistor;
a fourth transistor;
a fifth transistor;
a sixth transistor;
a first connection point connected to a gate terminal of the first transistor, a drain terminal of the second transistor and a source terminal of the third transistor;
a second connection point connected to a source terminal of the first transistor and a gate terminal of the second transistor;
a third connection point connected to a drain terminal of the first transistor and a drain terminal of the third transistor;
a fourth connection point connected to a gate terminal of the fourth transistor, a drain terminal of the fifth transistor and a source terminal of the sixth transistor;
a fifth connection point connected to a source terminal of the fourth transistor and a gate terminal of the fifth transistor; and
a sixth connection point connected to a drain terminal of the fourth transistor and a drain terminal of the sixth transistor.

10. The mixing circuit of claim 9, wherein the first transistor, the second transistor, the third transistor, the fourth transistor, the fifth transistor and the sixth transistor are a kind of field effect transistors.

11. The mixing circuit of claim 9, wherein the mixing circuit is implemented by CMOS fabricated process.

12. The mixing circuit of claim 9, wherein the mixing circuit is implemented by HEMT fabricated process.

13. The mixing circuit of claim 9, wherein the mixing circuit is a down converter circuit, a first signal is being applied to the first connection point and the fourth connection point, a second signal is being differentially applied to the second connection point and the fifth connection point, respectively, and two differential third signals are being extracted from the third connection point and the sixth connection point, respectively.

14. The mixing circuit of claim 13, wherein the two differential third signals are differential IF signals, one of the first signal and the second signal is a RF signal, and another one of the first signal and the second signal is a LO signal.

15. The mixing circuit of claim 9, wherein the mixing circuit is a down converter circuit, a first signal is being differentially applied to the first connection point and the fourth connection point, respectively, a second signal is being applied to the second connection point and the fifth connection point, and two differential third signals are being extracted from the third connection point and the sixth connection point, respectively.

16. The mixing circuit of claim 15, wherein the two differential third signals are differential IF signals, one of the first signal and the second signal is a RF signal, and another one of the first signal and the second signal is a LO signal.

17. The mixing circuit of claim 9, wherein the mixing circuit is an up converter circuit, a first signal is being applied to the first connection point and the fourth connection point, a second signal is being differentially applied to the second connection point and the fifth connection point, respectively, and two differential third signals are being extracted from the third connection point and the sixth connection point, respectively.

18. The mixing circuit of claim 17, wherein the two differential third signals are differential RF signals, one of the first signal and the second signal is an IF signal, and another one of the first signal and the second signal is a LO signal.

19. The mixing circuit of claim 9, wherein the mixing circuit is an up converter circuit, a first signal is being differentially applied to the first connection point and the fourth connection point, respectively, a second signal is being applied to the second connection point and the fifth connection point, and two differential third signals are being extracted from the third connection point and the sixth connection point, respectively.

20. The mixing circuit of claim 19, wherein the two differential third signals are differential RF signals, one of the first signal and the second signal is an IF signal, and another one of the first signal and the second signal is a LO signal.

* * * * *